(12) United States Patent
Oka et al.

(10) Patent No.: US 10,461,235 B2
(45) Date of Patent: Oct. 29, 2019

(54) METHOD OF MANUFACTURING SEMICONDUCTOR DEVICE

(71) Applicant: NICHIA CORPORATION, Anan-shi, Tokushima (JP)

(72) Inventors: Yuta Oka, Tokushima (JP); Masatsugu Ichikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/805,917

(22) Filed: Nov. 7, 2017

(65) Prior Publication Data

US 2018/0130935 A1 May 10, 2018

(30) Foreign Application Priority Data

Nov. 8, 2016 (JP) ................... 2016-217799

(51) Int. Cl.
*H01L 33/00* (2010.01)
*H01L 33/64* (2010.01)
(Continued)

(52) U.S. Cl.
CPC .......... *H01L 33/647* (2013.01); *H01L 33/486* (2013.01); *H01L 33/502* (2013.01);
(Continued)

(58) Field of Classification Search
CPC ... H01L 33/647; H01L 33/486; H01L 33/502; H01L 33/56; H01L 33/62; H01L 25/0753; H01L 33/54; H01L 33/60; H01L 33/64
See application file for complete search history.

(56) References Cited

U.S. PATENT DOCUMENTS

2005/0082563 A1* 4/2005 Tsai ................. C30B 25/02
257/103
2005/0168987 A1* 8/2005 Tamaoki ............ B43K 29/10
362/244
(Continued)

FOREIGN PATENT DOCUMENTS

JP 2011222574 A 11/2011
JP 2014033100 A 2/2014
(Continued)

*Primary Examiner* — Mounir S Amer
*Assistant Examiner* — Alexander Belousov
(74) *Attorney, Agent, or Firm* — Hunton Andrews Kurth LLP

(57) ABSTRACT

A method of manufacturing a semiconductor device includes disposing a substrate metal film on an upper surface of a substrate made of a metal; disposing a first element metal film on a lower surface of a first element; disposing a second element metal film on a lower surface of a second element; bonding the first element and the second element to the substrate so that an upper surface of the substrate metal film is in contact with a lower surface of the first element metal film and a lower surface of the second element metal film; oxidizing at least a portion of a region of the upper surface of the substrate metal film other than regions in contact with the first element metal film and the second element metal film; and disposing a wiring electrically connecting the first element and the second element, across and above the region oxidized.

20 Claims, 8 Drawing Sheets

(51) Int. Cl.
*H01L 33/48* (2010.01)
*H01L 33/50* (2010.01)
*H01L 33/56* (2010.01)
*H01L 33/62* (2010.01)
*H01L 25/075* (2006.01)
*H01L 33/60* (2010.01)
*H01L 33/54* (2010.01)

(52) U.S. Cl.
CPC .............. *H01L 33/56* (2013.01); *H01L 33/62* (2013.01); *H01L 25/0753* (2013.01); *H01L 33/54* (2013.01); *H01L 33/60* (2013.01); *H01L 33/64* (2013.01); *H01L 2224/48091* (2013.01); *H01L 2224/48137* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01); *H01L 2933/0075* (2013.01)

(56) References Cited

U.S. PATENT DOCUMENTS

| | | | |
|---|---|---|---|
| 2009/0141851 A1* | 6/2009 | Lee | G21C 3/20 376/417 |
| 2010/0187563 A1 | 7/2010 | Kuramoto et al. | |
| 2010/0190298 A1 | 7/2010 | Kuramoto et al. | |
| 2010/0302775 A1* | 12/2010 | Hata | B82Y 20/00 362/231 |
| 2012/0205689 A1 | 8/2012 | Welch et al. | |
| 2015/0048398 A1 | 2/2015 | Ichikawa et al. | |
| 2018/0159009 A1* | 6/2018 | Schwarz | H01L 23/142 |

FOREIGN PATENT DOCUMENTS

| | | |
|---|---|---|
| JP | 2015029079 A | 2/2015 |
| JP | 2015503840 A | 2/2015 |
| WO | 2010084742 A1 | 7/2010 |
| WO | 2010084746 A1 | 7/2010 |
| WO | 2014020790 A1 | 2/2014 |

\* cited by examiner

METHOD OF MANUFACTURING SEMICONDUCTOR DEVICE

CROSS-REFERENCE TO RELATED PATENT APPLICATION

The present application claims priority under 35 U. S. C. § 119 to Japanese Patent Application No. 2016-217799, filed Nov. 8, 2016. The contents of this application are incorporated herein by reference in their entirety.

BACKGROUND

Technical Field

The present disclosure relates to a method of manufacturing a semiconductor device.

Description of Related Art

Light emitting devices having a metal substrate and a plurality of light emitting elements have been proposed, for example, in Japanese Unexamined Patent Application Publication No. 2011-222574. The plurality of light emitting elements are mounted in a row on the metal substrate via an adhesive layer made of a silicone-based resin material, and are connected in series by using bonding wires as a wiring.

SUMMARY

In the light emitting devices as such described above, the adhesive layer is disposed between the light emitting elements and the metal substrate, which may reduce heat dissipation from the light emitting elements to the metal substrate. Moreover, the use of a metal substrate may lead to electrical breakdown between the wiring and the metal substrate.

Such a disadvantage can be overcome according to embodiments of the present invention as illustrated below. In an embodiment of the present disclosure, a method of manufacturing a semiconductor device, the method includes:

disposing a substrate metal film on an upper surface of a substrate made of a metal;

disposing a first element metal film on a lower surface of a first element;

disposing a second element metal film on a lower surface of a second element;

bonding the first element and the second element to the substrate so that an upper surface of the substrate metal film is in contact with a lower surface of the first element metal film and a lower surface of the second element metal film;

oxidizing at least a portion of a region of the upper surface of the substrate metal film other than regions in contact with the first element metal film and the second element metal film; and disposing a wiring electrically connecting the first element and the second element, across and above a region including the region oxidized in the oxidizing step.

A semiconductor device having high dissipation of heat generated from a first element and a second element and having high insulation resistance between the substrate and the wiring, can be manufactured easily.

DETAILED DESCRIPTION

First Embodiment

Method of Manufacturing Semiconductor Device 1

Figure 1A:
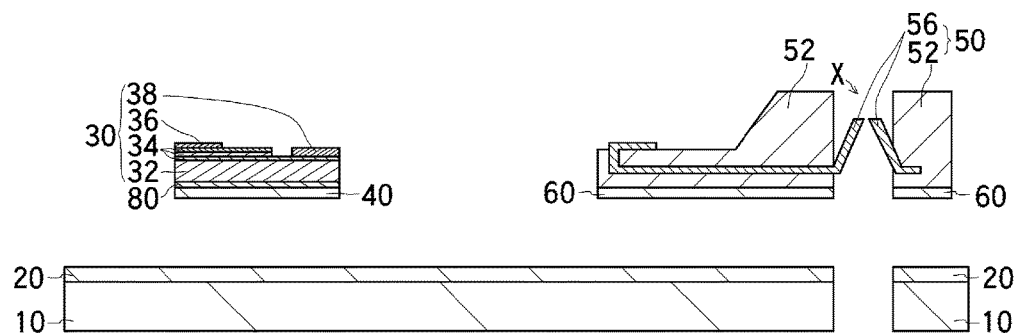
FIG. 1A is a schematic end surface view illustrating a method of manufacturing a semiconductor device according to a first embodiment of the present disclosure.
Figure 1B:
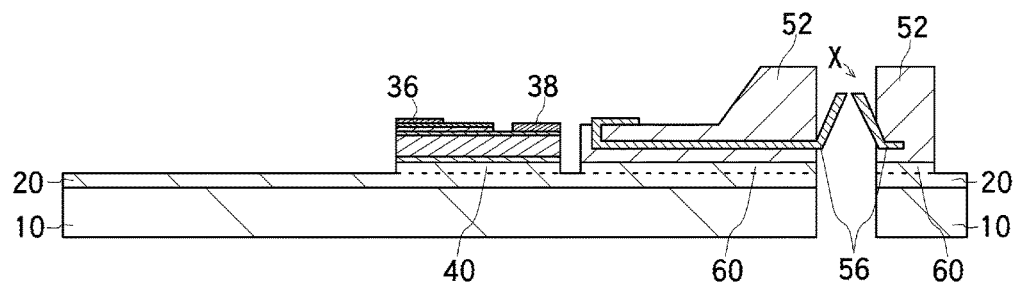
FIG. 1B is a schematic end surface view illustrating a method of manufacturing the semiconductor device according to the first embodiment of the present disclosure.
Figure 1C:
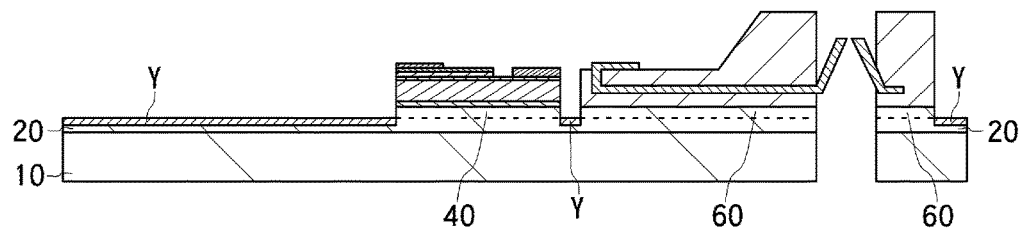
FIG. 1C is a schematic end surface view illustrating a method of manufacturing the semiconductor device according to the first embodiment of the present disclosure.
Figure 1D:
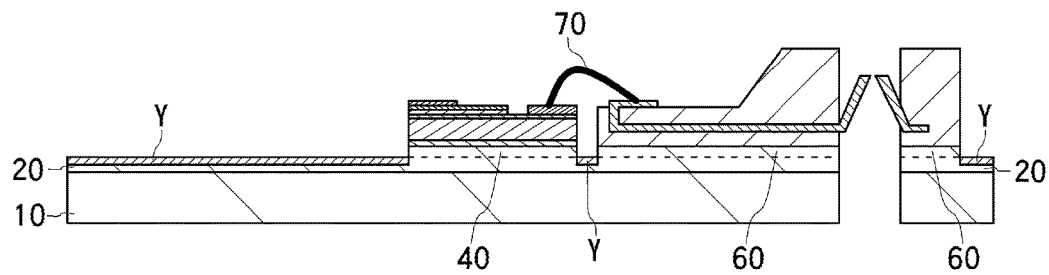
FIG. 1D is a schematic end surface view illustrating a method of manufacturing the semiconductor device according to the first embodiment of the present disclosure.
Figure 1E:
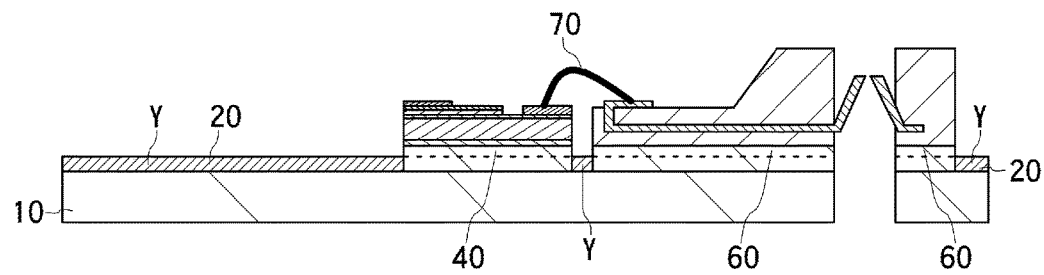
FIG. 1E is a schematic end surface view illustrating a method of manufacturing the semiconductor device according to the first embodiment of the present disclosure.
Figure 1F:
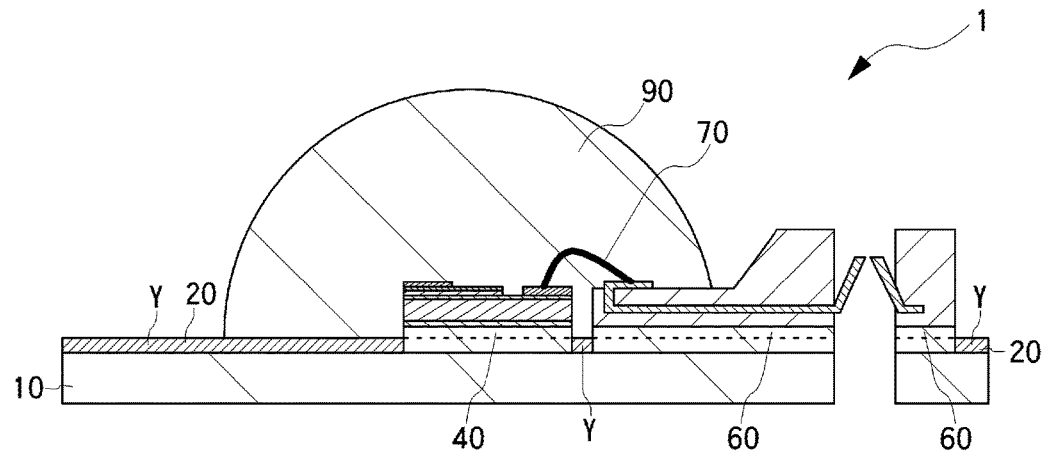
FIG. 1F is a schematic end surface view illustrating a method of manufacturing the semiconductor device according to the first embodiment of the present disclosure.
Figure 2:
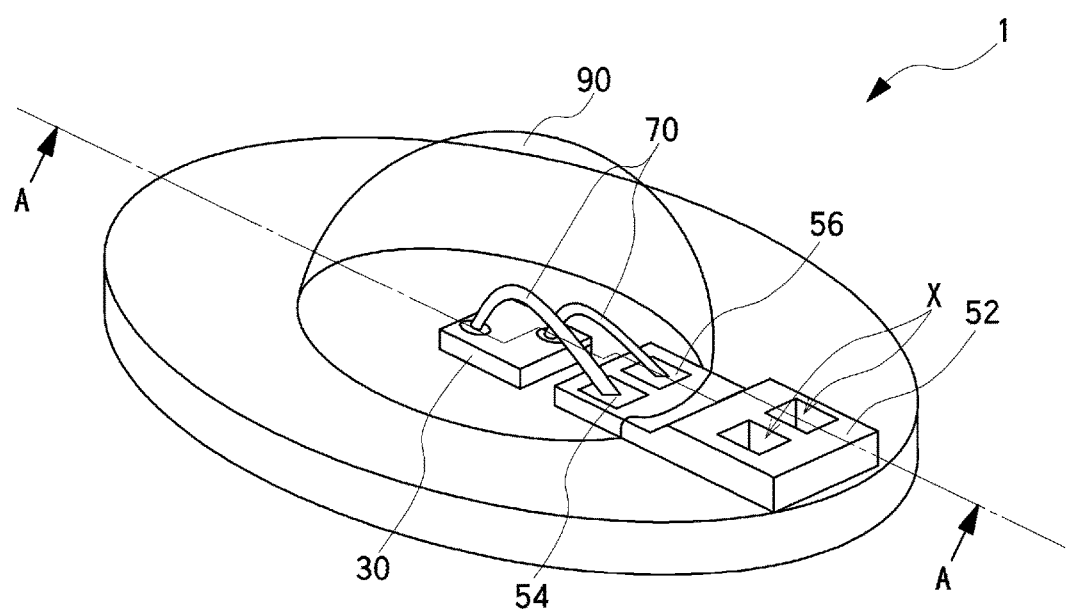
FIG. 2 is a schematic perspective view of the semiconductor device of FIG. 1F.

FIGS. 1A to 1F are schematic end surface views illustrating a method of manufacturing a semiconductor device 1 according to a first embodiment. FIG. 1A is a diagram illustrating disposing a substrate metal film 20, a first element metal film 40, and a second element metal film 60 (hereinafter may be collectively referred to as metal films 20, 40, and 60). FIG. 1B is a diagram illustrating bonding a first element 30 and a second element 50 to a substrate 10. FIG. 1C is a diagram illustrating a first oxidizing step. FIG. 1D is a diagram illustrating disposing a wiring 70. FIG. 1E is a diagram illustrating a second oxidizing step. FIG. 1F is a diagram illustrating disposing a sealing member 90. FIG. 2 is a schematic perspective view of the semiconductor device 1. FIG. 1A to FIG. 1F are end surface views taken along line A-A of FIG. 2, illustrating steps of manufacturing the semiconductor device 1.

As shown in FIG. 1A to FIG. 1F, the method of manufacturing a semiconductor device 1 includes disposing the substrate metal film 20 on an upper surface of the substrate 10 made of a metal, disposing the first element metal film 40 on a lower surface of the first element 30, disposing the second element metal film 60 on a lower surface of the second element 50, bonding the first element 30 and the second element 50 to the substrate 10 so that an upper surface of the substrate metal film 20 is in contact with a lower surface of the first element metal film 40 and a lower surface of the second element metal film 60, oxidizing at least a portion of the upper surface of the substrate metal film 20 other than regions in contact with the first element metal film 40 and the second element metal film 60, and disposing a wiring 70 electrically connecting the first element 30 and the second element 50, across and above the region Y oxidized in the oxidizing step.

In the first embodiment, a portion of the upper surface of the substrate metal film 20 is electrically insulated by oxidizing, while other portions (at least including a region being connected to the first element metal film 40 and a region being connected to the second element metal film 60) is maintained as a metal. While enhancing the insulation resistance between the wiring 70 and the substrate 10 by the insulated portion, heat generated by the first element 30 and the second element 50 can be efficiently dispersed toward the substrate 10 from the other portion that is maintained as a metal without being insulated. According to the first embodiment, dissipation of heat generated from the first element 30 and the second element 50 can be improved, and a semiconductor device having high insulation resistance between the substrate and the wiring can be easily manufactured. A method of manufacturing the semiconductor device 1 will be described in more detail below.

Disposing Substrate Metal Film 20

As shown in FIG. 1A, the substrate metal film 20 is disposed on the upper surface of the substrate 10 made of a metal. The substrate 10 preferably has a polished upper surface. Also, the first element 30 preferably has a polished lower surface. The upper surface of the substrate 10 and the lower surface of the first element 30 can be made flatter by polishing. Accordingly, the upper surface of the substrate metal film 20 and the lower surface of the first element metal film 40 that are respectively disposed on the upper surface of the substrate 10 and the lower surface of the first element 30 can be made flatter. Accordingly, it is difficult to form a gap in a bonding interface between the substrate metal film 20 and the first element metal film 40, so that dissipation of heat from the first element 30 to the substrate 10 can be enhanced.

For the substrate 10 made of a metal, a material containing Al (aluminum) that has good heat dissipating properties is preferably used. When using a substrate 10 with polished upper surface made of a material containing Al, a substrate 10 made of an aluminum-based alloy is particularly preferably employed, because an aluminum-based alloy has higher strength than pure Al, allowing easy polishing. When a substrate 10 made of an aluminum-based alloy is used, an alloy that contains Al in a range of, for example, 85 wt % to 99.9 wt % is particularly preferable to maintain heat dissipation and to obtain high strength.

In the first embodiment, the substrate 10 employs a flat-plate shape, but the substrate 10 may also have a defined recess in its upper surface, with which, in the step of disposing the sealing member 90 to be described below, excessive spreading of the sealing member 90 can be avoided.

For the substrate metal film 20, a film containing Al can be preferably used. This is because Al has particularly good heat dissipating properties and when oxidized (that is, in the form of aluminum oxide), exhibits relatively high insulation resistance. The content of Al in the substrate metal film 20 is preferably higher than the content of Al in the substrate 10. Accordingly, when the first element 30 is a light emitting element, light from the first element 30 can be easily reflected. For the substrate metal film 20, a film containing Zr, Ta, Si, Ti, or Cr, or the like, can also be used, in place of the film containing Al.

The substrate metal film 20 preferably has a thickness in a range of 5 nm to 100 nm, more preferably in a range of 10 nm to 50 nm. With the thickness equal to or greater than such a lower-limit value, occurrence of electric breakdown can be easily reduced, and with the thickness equal to or smaller than such an upper-limit value, dissipation of heat generated from the first element 30 and the second element 50 can be facilitated.

Disposing First Element Metal Film 40

As shown in FIG. 1A, the first element metal film 40 is disposed on a lower surface of the first element 30. The first element 30 is not provided with an electrode on its lower surface. In the first embodiment, a light emitting diode (LED) is used for the first element 30.

In the first embodiment, the first element metal film 40 is disposed on the lower surface of the LED via a dielectric multilayer film 80 configured to reflect light of the LED. With this arrangement, light from the LED can be reflected by the dielectric multilayer film 80 provided between the lower surface of the LED and the first element metal film 40. Accordingly, absorption of light by the first element metal film 40 can be reduced and extraction of light of the LED to the outside of the semiconductor device 1 can be facilitated. The light that is not reflected by the dielectric multilayer film 80 is not entirely absorbed by the first element metal film 40 and a portion of the light is reflected by the first element metal film 40.

In the first embodiment, an LED having a semiconductor structure 34 on an upper surface of an insulating growth substrate 32 and a p-side electrode 36 and an n-side electrode 38 on an upper surface of the semiconductor structure 34 is employed. The distance between the lower surface of the LED and the upper surface of the LED can be increased by the thickness of the growth substrate 32, compared to an LED that does not have the growth substrate 32. With this configuration, occurrence of electrical breakdown between the wiring 70 and the substrate 10 can be greatly reduced. The distance between the lower surface of the LED and the upper surface of the LED is preferably in a range of 50 μm to 850 μm, more preferably in a range of 100 μm to 200 μm. With the distance equal to or greater than the lower-limit value as described above, occurrence of electrical breakdown can be greatly reduced, and with the distance equal to or smaller than the upper-limit value as described above, dissipation of heat generated from the LED can be facilitated. For the first element 30, a laser diode (LD), a transistor, an IC, or the like, can be used as well as an LED.

For the first element metal film 40, a material similar to that exemplified for the substrate metal film 20 can be used. In the first embodiment, a material used for the substrate metal film 20 is also used for the first element metal film 40. With the use of the same material for both the metal films, direct bonding between both metal films can be facilitated. A material different from that used for the substrate metal film 20 may also be used for the first element metal film 40.

The first element metal film 40 preferably has a thickness in a range of 1 nm to 90 nm, more preferably in a range of 5 nm to 40 nm. The thickness equal to or greater than the lower-limit value as described above, can facilitate bonding of the first element metal film 40 and the substrate metal film 20, and with the thickness equal to or smaller than the upper-limit value as described above, reduction in dissipation of heat generated from the first element 30 can be reduced.

In the step of disposing the first element metal film 40, the thickness of the first element metal film 40 is preferably smaller than the thickness of the substrate metal film 20. With the configuration as described above, insulation between the wiring 70 and the substrate 10 can be enhanced in a region other than a region below the first element 30, while securing dissipation of heat generated from the first element 30 in a region below the first element 30.

Disposing Second Element Metal Film 60

As shown in FIG. 1A, the second element metal film 60 is disposed on a lower surface of the second element 50. The second element 50 is not provided with a terminal or an electrode on its lower surface.

In the first embodiment, as shown in FIG. 1A and FIG. 2, a connector is used as the second element 50. The connector includes a base 52 formed with a hole X, and terminals 54 and 56 disposed on an upper surface of the base 52. The terminals 54 and 56 of the second element 50 are a p-side terminal 56 and an n-side terminal 54. The terminals 54 and 56 are partially exposed in the holes X defined in the base 52, respectively. Electric power can be supplied to the semiconductor device 1 by engaging external electrodes (pins or the like) to portions of the exposed terminals 54 and 56 respectively.

In order to facilitate wiring 70 in a later step, the distances between the lower surface of the second element 50 and the upper surfaces of the terminals 54 and 56 of the second element 50 are preferably substantially the same as the distances between the lower surface of the first element 30 and the upper surfaces of the electrodes 36 and 38 of the first element 30. In the first embodiment, the distance between the lower surface of the second element 50 and the upper surface of the n-side electrode 54 and the distance between the lower surface of the first element 30 and the upper surface of the p-side electrode 36 are substantially the same. Alternatively, the distance between the lower surface of the second element 50 and the upper surface of the p-side electrode 56 and the distance between the lower surface of the first element 30 and the upper surface of the n-side electrode 38 may be substantially the same. In order to reduce electric resistance of the wiring 70, the terminals 54 and 56 on the upper surface of the second element 50 are located closer to the first element 30, respectively. When viewed from above the upper surfaces, the distance between the end portion of the second element 50 closer to the first element 30 and the p-side terminal 56 and the n-side terminals 54 of the second element 50 can be in a range of 0.5 mm to 2.0 mm, respectively. For the second element 50, an element similar to that exemplified for the first element 30 can also be used as well as the connector.

For the second element metal film 60, a material similar to that exemplified for the substrate metal film 20 can be used. The second element metal film 60 may have a thickness the same as or different from that of the first element metal film 40.

Disposing substrate metal film 20, disposing first element metal film 40, and disposing second element metal film 60 can be performed at the same time or sequentially. When performed sequentially, an appropriate order can be determined.

Bonding First Element 30 and Second Element 50 to Substrate 10

Next, as shown in FIG. 1B, the first element 30 and the second element 50 are bonded to the substrate 10 so that the upper surface of the substrate metal film 20 is in contact with the lower surface of the first element metal film 40 and the lower surface of the second element metal film 60. In the first embodiment, the first element 30 and the second element 50 are arranged on the upper surface of the substrate 10 so that the electrodes 36 and 38 of the first element 30 and the terminals 54 and 56 of the second element 50 face upward, respectively. In the first embodiment, the upper surface of the substrate metal film 20 is simultaneously bonded to the lower surface of the first element metal film 40 and the lower surface of the second element metal film 60. With this, a plurality of members can be bonded at the same time, so that the number of steps can be reduced compared to that when the plurality of members are sequentially bonded by using an adhesive such as resin.

For the bonding, an atomic diffusion bonding technique, a surface activated bonding technique, or the like, can be used. With such a technique, degradation of the first element 30 and the second element 50 (hereinafter may be referred to as "respective elements 30 and 50") caused by the heat at the time of bonding can be greatly reduced. When an atomic diffusion bonding technique is used, it is preferable to perform polishing of the substrate 10, disposing respective metal films 20, 40, and 60, and bonding the substrate 10 to respective elements 30 and 50 while the substrate 10 and respective elements 30 and 50 are arranged in an ultrahigh vacuum atmosphere. When a material containing Al is used for the substrate 10, an oxide film (i.e., rust) may occur on the surface of the substrate 10 and/or the surfaces of the respective metal films 20, 40, and 60. However, in an ultrahigh vacuum atmosphere, occurrence of an oxide film on the surface of the substrate 10 and the surfaces of the respective elements 30 and 50 can be reduced between removal of oxide film on the surface of the substrate 10 by polishing and bonding the substrate 10 with the respective elements 30 and 50. Accordingly, heat generated from the respective elements 30 and 50 can be efficiently dissipated.

First Oxidizing Step

Next, as shown in FIG. 1C, in a first oxidizing step of the upper surface of the substrate metal film 20, at least a portion of a region of the upper surface of the substrate metal film 20 is oxidized. Accordingly, at least a portion of a region of the entire upper surface of the substrate metal film 20 other than regions in contact with the first element metal film 40 and the second element metal film 60 is oxidized. In the first embodiment, in the first oxidizing step, an entire region (region indicated by "Y" in FIG. 1C) of the upper surface of the substrate metal film 20 is oxidized other than regions in contact with the first element metal film 40 and the second element metal film 60. As described in the step of disposing the wiring 70 below, when seen from above, the wiring 70 is disposed at a location overlapping the oxidized region Y.

In the first oxidizing step, a portion of the upper surface of the substrate metal film 20 (the region indicated by "Y" in FIG. 1C) is oxidized from the upper surface into at least a portion in a thickness direction (in other words, an upper portion of cross section). In the present step, in addition to the portion of the upper surface of the metal substrate film 20, the entire region in the thickness direction corresponding to the portion of the upper surface may be oxidized. In this case, a second oxidizing step to be described below can be omitted.

In the first oxidizing step, an intermediate product provided by the bonding step may be oxidized by placing the device under an oxidizing atmosphere. In the first embodiment, the intermediate product provided by bonding step is exposed to air as this step of placing the device under an oxidizing atmosphere. According to the first embodiment, for the substrate metal film 20, the region in contact with the first element metal film 40 (the region below the first element 30) and the region in contact with the second element metal film 60 (the region below the second element 50) are not exposed to the outside, so that those regions are not oxidized by the air and maintain a respective metallic nature. Meanwhile, the region of the substrate metal film 20 that is not in contact with the first element metal film 40 and the second element metal film 60 is exposed to the outside, so that the region is oxidized by the air and is insulated.

Disposing Wiring 70

Next, as shown in FIG. 1D, a wiring 70 is disposed to electrically connect the first element 30 and the second element 50 and across and above a region including the oxidized region Y. In the first embodiment, the n-side electrode 38 of the first element 30 and the p-side terminal 56 of the second element 50 are electrically connected by a bonding wire, and the p-side electrode 36 of the first element 30 and the n-side terminal 54 of the second element 50 are electrically connected by a bonding wire. With the use of the bonding wires, a sufficient distance between the upper surface of the substrate 10 and the wiring 70 can be easily secured, so that insulation between the substrate 10 and the wiring 70 can be easily secured. Alternatively, in place of the bonding wires, metal films may be disposed on the oxidized region to use as the wiring.

Second Oxidizing Step

In the first embodiment, as shown in FIG. 1E, after the step of disposing the wiring 70, a second oxidizing step of exposing the intermediate product provided by the first oxidizing step to oxygen gas or water vapor is performed. With this, the oxidized region Y of the substrate metal film 20 that is oxidized in the first oxidizing step can be further oxidized downward (in the thickness direction). That is, the oxidized portion can be increased in a downward direction. Accordingly, occurrence of electrical breakdown can be further reduced. When the substrate metal film 20 is sufficiently oxidized in the first oxidizing step, the second oxidizing step can be omitted. The second oxidizing step can also be performed after the first oxidizing step and before the step of disposing the wiring 70. In particular, when a metal film is used as the wiring 70, the second oxidizing step is performed after the first oxidizing step and before the step of disposing the wiring 70.

Disposing Sealing Member 90

Next, as shown in FIG. 1F, a sealing member 90 is disposed to cover the first element 30. In the first embodiment, a resin containing a fluorescent material is used for the sealing member 90. Also, in the first embodiment, the sealing member 90 is disposed to cover the electrodes 36 and 38 of the first element 30 and the terminals 54 and 56 of the second element so as to increase the withstand voltage of the substrate 10 and the wiring 70. The present step of disposing the sealing member 90 is optional.

Second Embodiment

Method of Manufacturing Semiconductor Device 2

Figure 3A:
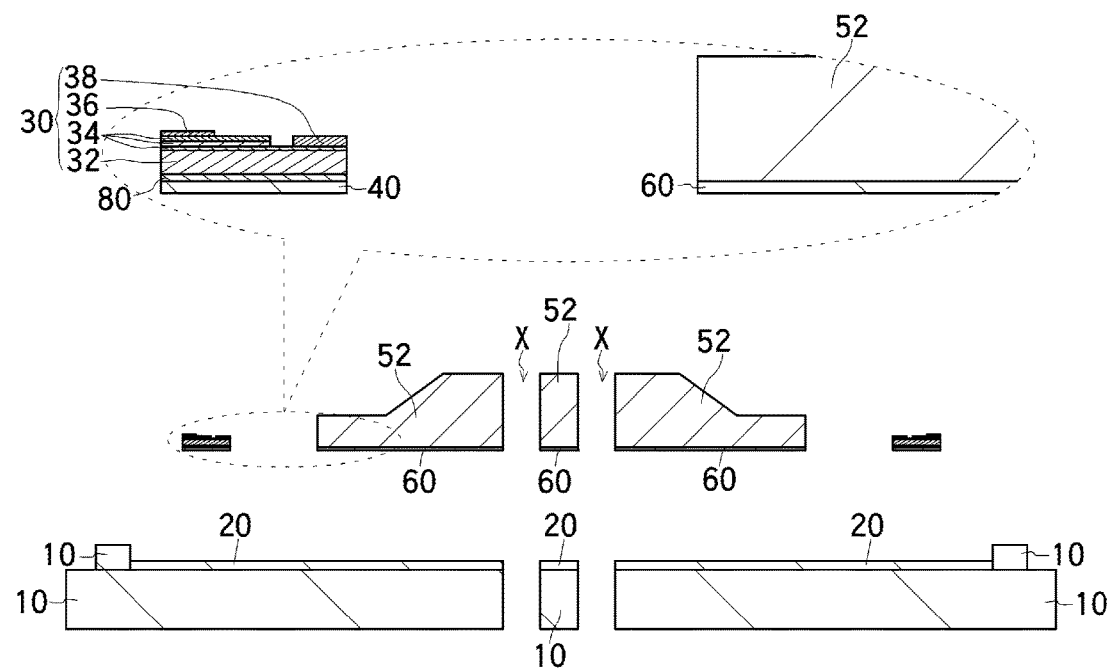
FIG. 3A is a schematic end surface view illustrating a method of manufacturing a semiconductor device according to a second embodiment of the present disclosure.
Figure 3B:
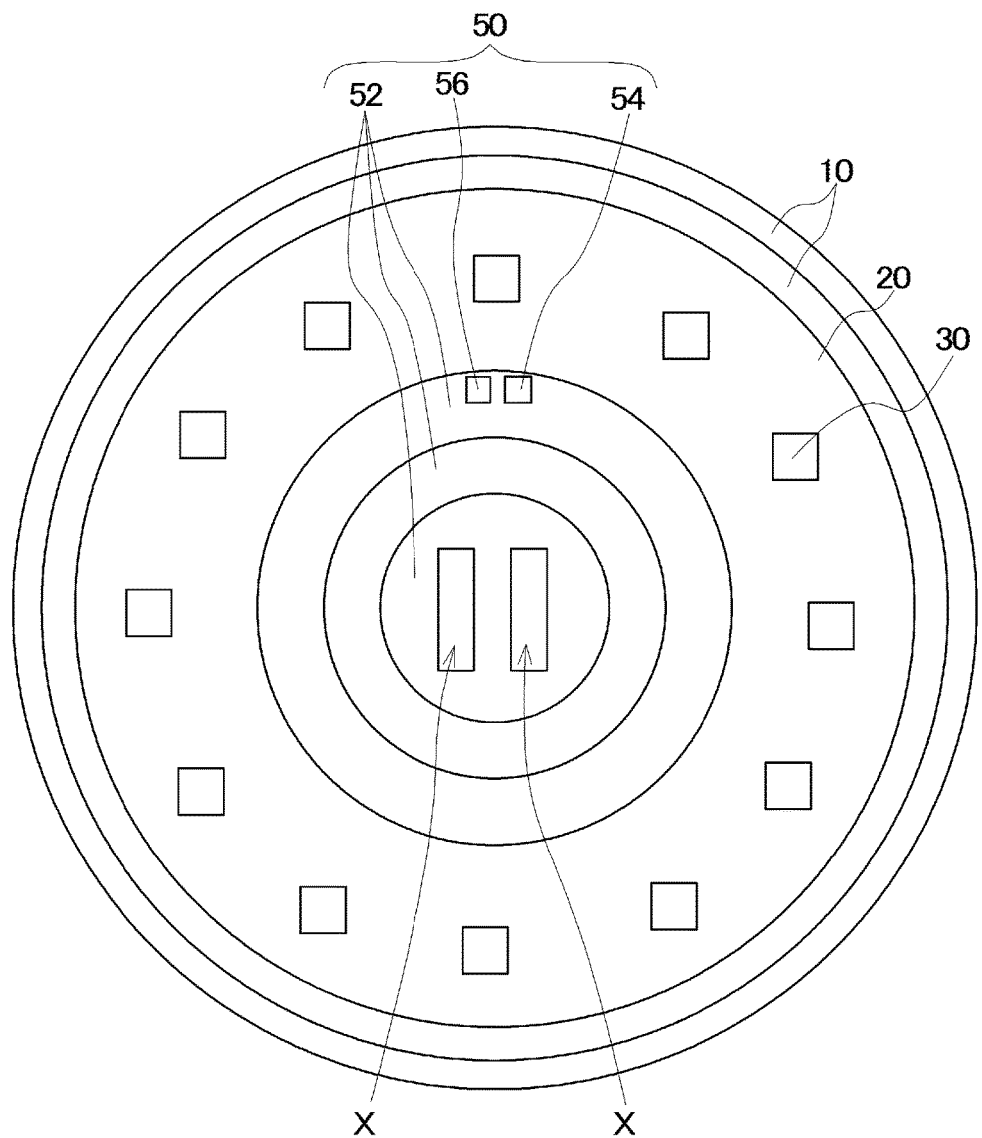
FIG. 3B is a schematic upper surface view illustrating a method of manufacturing the semiconductor device according to the second embodiment of the present disclosure.
Figure 3C:
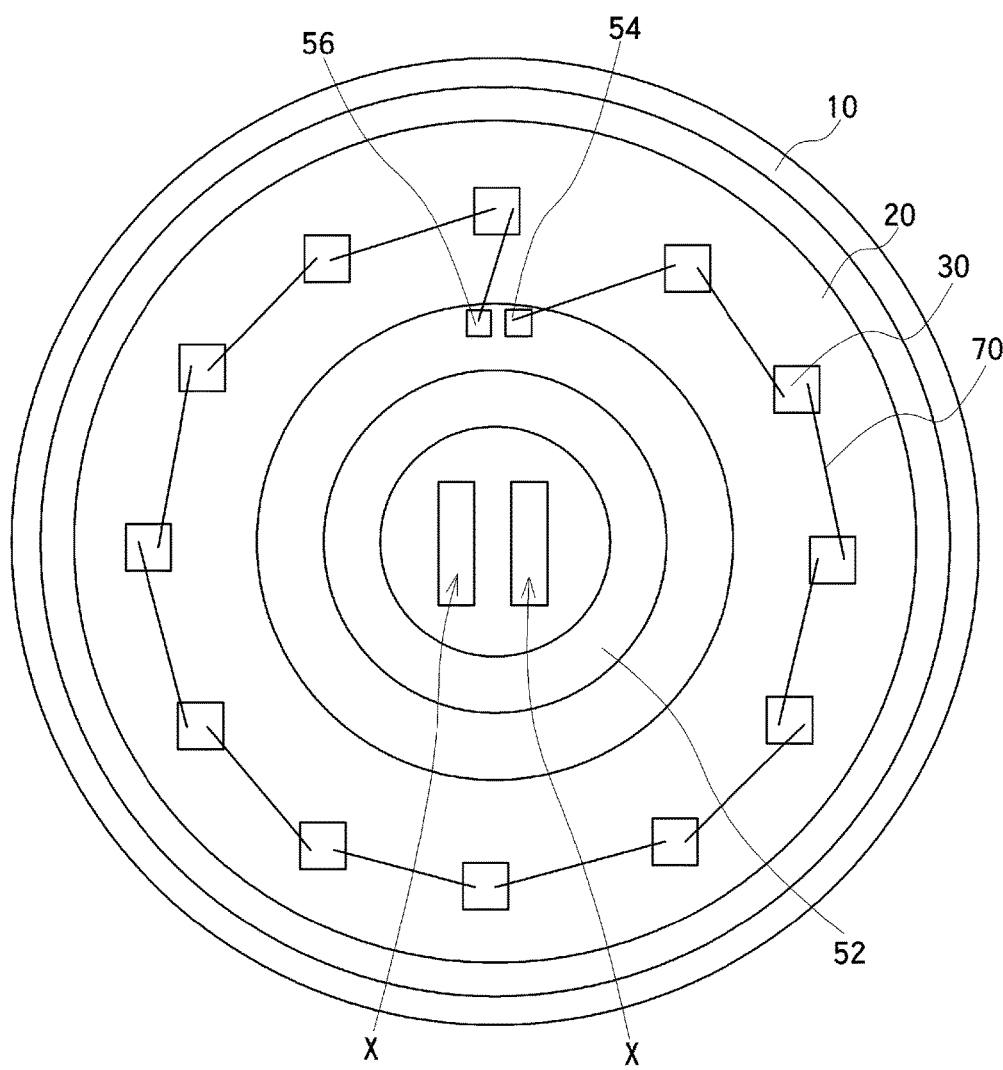
FIG. 3C is a schematic upper surface view illustrating a method of manufacturing the semiconductor device according to the second embodiment of the present disclosure.
Figure 3D:
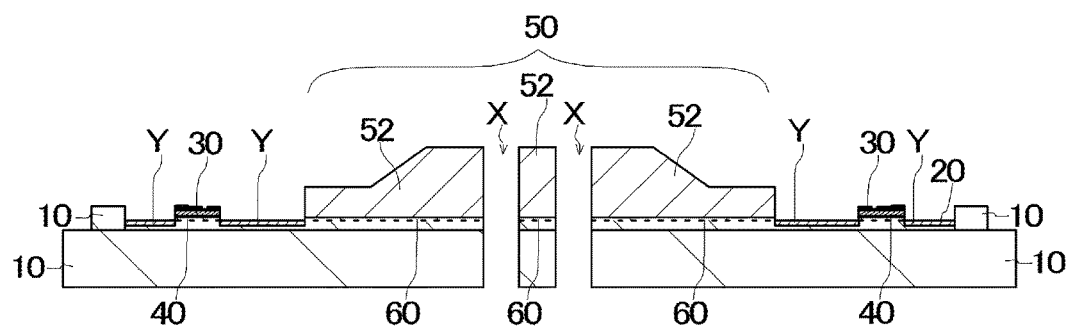
FIG. 3D is a schematic upper surface view illustrating a method of manufacturing the semiconductor device according to the second embodiment of the present disclosure.
Figure 3E:
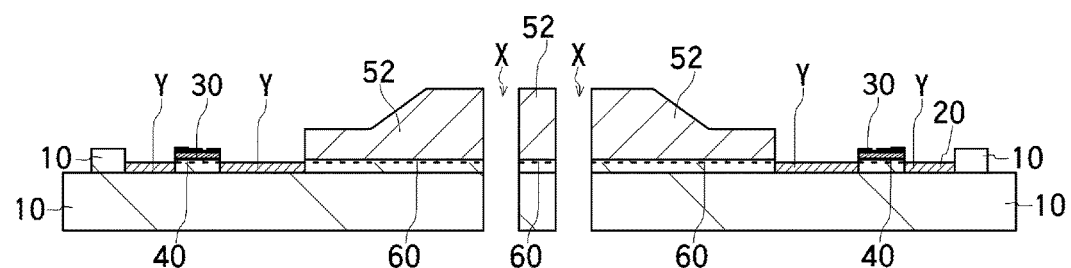
FIG. 3E is a schematic upper surface view illustrating a method of manufacturing the semiconductor device according to the second embodiment of the present disclosure.
Figure 3F:
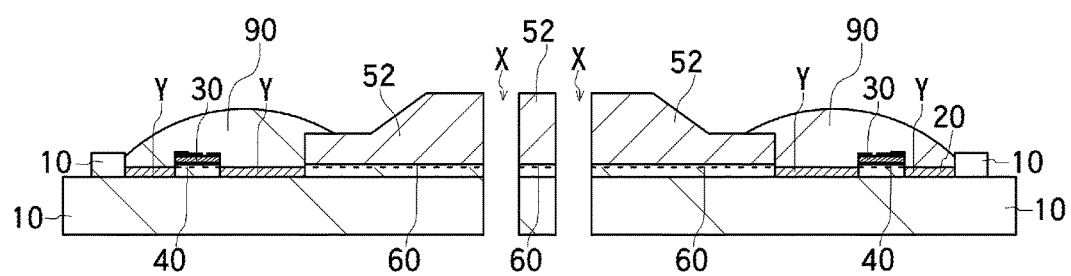
FIG. 3F is a schematic upper surface view illustrating a method of manufacturing the semiconductor device according to the second embodiment of the present disclosure.
Figure 4:
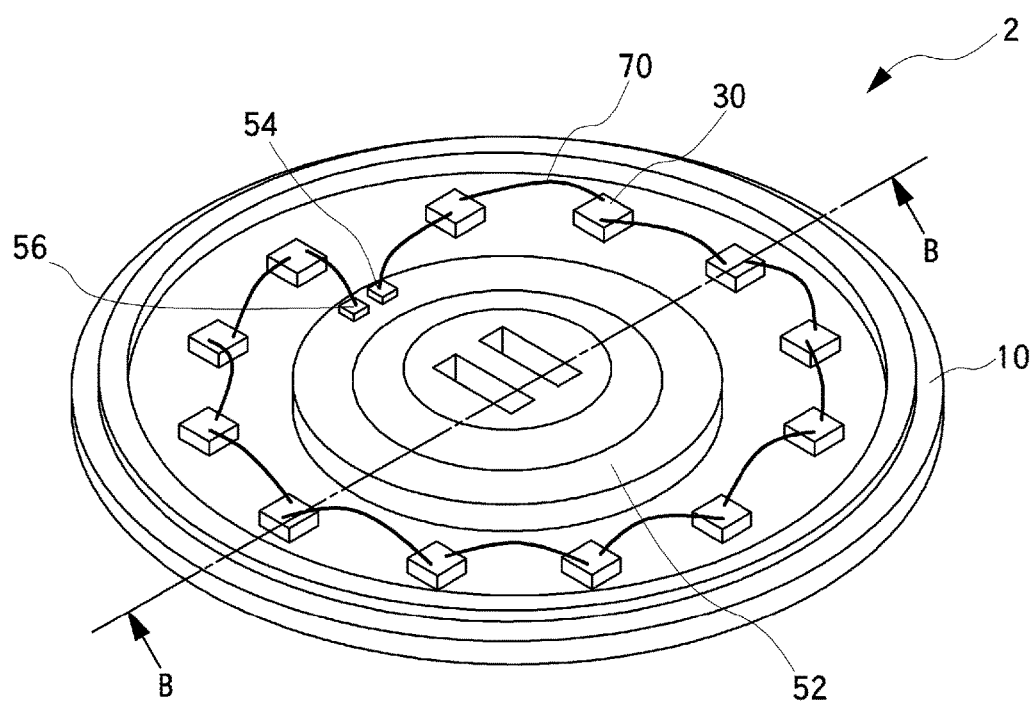
FIG. 4 is a schematic perspective view of the semiconductor device FIG. 3F.

FIG. 3A to FIG. 3F are diagrams illustrating a method of manufacturing a semiconductor device 2 according to a second embodiment. FIG. 3A is an end surface view illustrating disposing a substrate metal film 20, a plurality of first element metal films 40, and a second element metal film 60. FIG. 3B is a top view illustrating bonding a plurality of first elements 30 and a second element 50 to a substrate 10. FIG. 3C is a top view illustrating disposing a wiring 70. FIG. 3D is an end surface view illustrating a first oxidizing step. FIG. 3E is an end surface view illustrating a second oxidizing step. FIG. 3F is an end surface view illustrating disposing a sealing member 90. FIG. 4 is a perspective view of the semiconductor device 2. For the simplicity of explanation, the sealing member 90 is not shown in FIG. 4. FIGS. 3A, 3D, 3E and 3F are end surface views taken in the line B-B of FIG. 4, illustrating steps of manufacturing the semiconductor device 2. The second embodiment is similar to those in the first embodiment except for those described below. Now, mainly the differences will be described below.

In the second embodiment, a substrate 10 is formed with a recess in its upper surface. Also, a wiring 70 is disposed above the substrate metal film 20. Then, as shown in FIG. 3D, of the upper surface of the substrate metal film 20, a region Y is oxidized that includes at least a portion below the wiring 70 and other than regions in contact with the plurality of first element metal films 40 and the second element metal film 60. Also, a plurality of LEDs is used as the first elements 30. In a step of bonding the first elements 30 and a second element 50 to the substrate 10, as shown in FIG. 3B, a connector that serves as the second element 50 is arranged at a center of the substrate 10 and a plurality of first elements 30 is arranged along the periphery of the second element 50. In the second embodiment, employing the connector as the second element 50 is optional. When the connector is not used, for example, one of the plurality of LEDs may be referred to as the first element 30, and the rest of the plurality of LEDs may be referred to as the second element 50.

The semiconductor device 2 having good heat dissipating properties and high insulation resistance can also be easily manufactured according to the second embodiment.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a semiconductor device, the method comprising:
    disposing a substrate metal film on an upper surface of a substrate made of a metal;
    disposing a first element metal film on a lower surface of a first element;
    disposing a second element metal film on a lower surface of a second element;
    after disposing the substrate metal film, the first element metal film and the second element metal film, bonding the first element and the second element to the substrate so that an upper surface of the substrate metal film is in contact with a lower surface of the first element metal film and a lower surface of the second element metal film;
    after bonding the first element and the second element to the substrate, oxidizing at least a portion of a region of the upper surface of the substrate metal film other than regions in contact with the first element metal film and the second element metal film; and
    after oxidizing the at least portion of the region of the upper surface of the substrate metal film other than the regions in contact with the first element metal film and the second element metal film, disposing a wiring electrically connecting the first element and the second element, across and above a region including the region oxidized in the oxidizing step.

2. The method of manufacturing a semiconductor device according to claim 1, wherein in the step of disposing the first element metal film, an LED is used as the first element, and in the step of disposing the second element metal film, a connector is used as the second element.

3. The method of manufacturing a semiconductor device according to claim 2, wherein in the step of disposing the substrate metal film, the substrate has a polished upper surface, and in the step of disposing the first element metal film, the first element has a polished lower surface.

4. The method of manufacturing a semiconductor device according to claim 3, wherein in the step of disposing the first element metal film, the first element metal film is disposed via a dielectric multilayer film configured to reflect light of the LED.

5. The method of manufacturing a semiconductor device according to claim 1, wherein in the step of disposing the substrate metal film, the substrate is made of an aluminum-based alloy.

6. The method of manufacturing a semiconductor device according to claim 5, wherein in the step of disposing the substrate metal film, the substrate metal film contains aluminum, and wherein an aluminum content of the substrate metal film is greater than an aluminum content of the substrate.

7. The method of manufacturing a semiconductor device according to claim 6, wherein in the step of disposing the first element metal film, a film containing aluminum is used as the first element metal film, and in the step of disposing the second element metal film, a film containing aluminum is used as the second element metal film.

8. The method of manufacturing a semiconductor device according to claim 1, wherein the step of oxidizing the substrate metal film includes a first oxidizing step, in which an intermediate product provided by the step of bonding is exposed to atmospheric air; the method further comprising, after the first oxidizing step and before or after the step of disposing the wiring, a second oxidizing step is performed, in which an intermediate product provided by the first oxidizing step is exposed to oxygen gas or water vapor.

9. The method of manufacturing a semiconductor device according to claim 1, wherein in the step of disposing the first element metal film, the first element metal film is disposed to have a thickness smaller than a thickness of the substrate metal film.

10. The method of manufacturing a semiconductor device according to claim 1 wherein in the step of disposing the first element metal film, an LED is used as the first element, and in the step of disposing the second element metal film, an LED is used as the second element.

11. A method of manufacturing a semiconductor device comprising:
    disposing a substrate metal film on an upper surface of a substrate made of a metal;
    disposing a first element metal film on a lower surface of a first element;
    disposing a second element metal film on a lower surface of a second element;
    after disposing the substrate metal film, the first element metal film and the second element metal film, bonding the first element and the second element to the substrate so that an upper surface of the substrate metal film is in contact with a lower surface of the first element metal film and a lower surface of the second element metal film;
    after bonding the first element and the second element to the substrate, disposing a wiring at a location higher than the substrate metal film and spaced apart from the substrate metal film, to electrically connect the first element and the second element; and
    after bonding the first element and the second element to the substrate, oxidizing a region of the upper surface of the substrate metal film that includes at least a region located lower than the wiring and other than regions of the upper surface of the substrate metal film that are in contact with the first element metal film and the second element metal film.

12. The method of manufacturing a semiconductor device according to claim 11, wherein in the step of disposing the first element metal film, an LED is used as the first element, and in the step of disposing the second element metal film, a connector is used as the second element.

13. The method of manufacturing a semiconductor device according to claim 12, wherein in the step of disposing the first element metal film, a substrate having a polished upper surface is used, and in the step of disposing the first element metal film, a first element having a polished lower surface is used.

14. The method of manufacturing a semiconductor device according to claim 13, wherein in the step of disposing the first element metal film, the first element metal film is disposed via a dielectric multilayer film that is configured to reflect light of the LED.

15. The method of manufacturing a semiconductor device according to claim 11, wherein in the step of disposing the substrate metal film, a substrate made of an aluminum-based alloy is used.

16. The method of manufacturing a semiconductor device according to claim 15, wherein in the step of disposing the substrate metal film, the substrate metal film contains aluminum, and wherein an aluminum content of the substrate metal film is greater than an aluminum content of the substrate.

17. The method of manufacturing a semiconductor device according to claim 16, wherein in the step of disposing the first element metal film, a film containing aluminum is used as the first element metal film, and in the step of disposing the second element metal film, a film containing aluminum is used as the second element metal film.

18. The method of manufacturing a semiconductor device according to claim 11, wherein the step of oxidizing the substrate metal film includes a first oxidizing step, in which an intermediate product provided by the step of bonding is exposed to atmospheric air; the method further comprising a second oxidizing step after the first oxidizing step, in which an intermediate product provided by the first oxidizing step is exposed to oxygen gas or water vapor.

19. The method of manufacturing a semiconductor device according to claim 11, wherein in the step of disposing the first element metal film, the first element metal film is disposed to have a thickness smaller than a thickness of the substrate metal film.

20. The method of manufacturing a semiconductor device according to claim 11, wherein in the step of disposing the first element metal film, an LED is used as the first element, and in the step of disposing the second element metal film, a connector is used as the second element.

* * * * *